(12) United States Patent
Viswanathan et al.

(10) Patent No.: US 9,459,320 B2
(45) Date of Patent: Oct. 4, 2016

(54) FAULT DETECTION IN BRUSHLESS EXCITERS

(71) Applicant: ROLLS-ROYCE PLC, London (GB)

(72) Inventors: Vaiyapuri Viswanathan, Singapore (SG); Chandana Gajanayake, Singapore (SG); Amit Gupta, Singapore (SG); Sivakumar Nadarajan, Singapore (SG)

(73) Assignee: ROLLS-ROYCE plc, London (GB)

( * ) Notice: Subject to any disclaimer, the term of this patent is extended or adjusted under 35 U.S.C. 154(b) by 34 days.

(21) Appl. No.: 14/573,573

(22) Filed: Dec. 17, 2014

(65) Prior Publication Data

US 2015/0198668 A1 Jul. 16, 2015

(30) Foreign Application Priority Data

Jan. 16, 2014 (GB) .................................. 1400701.7

(51) Int. Cl.
| | |
|---|---|
| H02P 11/00 | (2006.01) |
| G01R 31/34 | (2006.01) |
| H02H 7/06 | (2006.01) |
| H02P 9/10 | (2006.01) |
| H02P 9/00 | (2006.01) |

(52) U.S. Cl.
CPC ............ *G01R 31/343* (2013.01); *H02H 7/065* (2013.01); *H02P 9/00* (2013.01); *H02P 9/102* (2013.01); *H02P 11/00* (2013.01)

(58) Field of Classification Search
CPC ........... H02H 7/065; H02H 1/04; H02P 9/34
USPC ........ 322/20, 24, 28, 44, 58, 59, 89, 91, 68, 322/95
See application file for complete search history.

(56) References Cited

U.S. PATENT DOCUMENTS 3,440,509 A * 4/1969 Hoffmann ................. H02J 3/42
                                                    318/707

(Continued)

FOREIGN PATENT DOCUMENTS

| DE | 102008043103 A1 | 4/2010 |
| EP | 0306319 A1 | 3/1989 |

(Continued)

OTHER PUBLICATIONS

Penman, J. et al. "The Detection of Stator and Rotor Winding Short Circuits in Synchronous Generators by Analysing Excitation Current Harmonics," International Conference on Opportunities and Advances in International Power Generation, Conference Publication No. 419, pp. 137-142, 1996.

(Continued)

*Primary Examiner* — Julio C. Gonzalez Ramirez
(74) *Attorney, Agent, or Firm* — Oliff PLC

(57) ABSTRACT

A method for detecting a fault in an exciter circuit, suitable for use in a brushless generator, the exciter circuit including (a) an exciter armature winding, having a plurality of armatures, arranged to generate a multiphase AC signal, each armature of the plurality of armatures providing a respective sub-signal component of the multiphase AC signal, and (b) a rectifier circuit for receiving the sub-signals via the respective armatures, the rectifier circuit comprising a plurality of components arranged to rectify the sub-signals to provide a rectified output signal, wherein the method includes the steps of: acquiring a respective operational sub-value for a first characteristic of each of at least two of the respective sub-signals; deriving an operational value indicative of a relationship between the acquired respective operational sub-values; determining whether a fault has occurred in the exciter circuit on the basis of the derived operational value.

13 Claims, 13 Drawing Sheets

(56) References Cited

U.S. PATENT DOCUMENTS

| | | | | | |
|---|---|---|---|---|---|
| 3,467,935 | A | * | 9/1969 | Keady | H01H 85/0241 337/229 |
| 3,705,331 | A | * | 12/1972 | South | H02H 7/065 322/25 |
| 4,164,705 | A | * | 8/1979 | Whitney | H02H 7/065 310/68 D |
| 4,349,813 | A | * | 9/1982 | Ishibashi | H02K 11/042 310/68 R |
| 4,486,801 | A | * | 12/1984 | Jackovich | H02H 7/065 322/59 |
| 5,453,901 | A | | 9/1995 | Lackey | |
| 5,554,923 | A | * | 9/1996 | Maddali | H02P 9/10 322/25 |
| 6,320,731 | B1 | * | 11/2001 | Eaves | H02H 7/0805 361/30 |
| 2011/0216449 | A1 | | 9/2011 | Reschovsky et al. | |
| 2011/0295558 | A1 | * | 12/2011 | Fish | H02P 29/0088 702/184 |
| 2015/0198655 | A1 | * | 7/2015 | Viswanathan | G01R 23/02 324/762.07 |
| 2015/0260794 | A1 | * | 9/2015 | Athikessavan | G01R 31/343 702/58 |

FOREIGN PATENT DOCUMENTS

| | | |
|---|---|---|
| JP | S53804 A | 1/1978 |
| JP | S55122462 A | 9/1980 |
| JP | S5788854 A | 6/1982 |
| JP | S61262055 A | 11/1986 |
| JP | 04372559 A * | 12/1992 |
| WO | 2011109489 A1 | 9/2011 |
| WO | 2013/004285 A1 | 1/2013 |

OTHER PUBLICATIONS

Dec. 3, 2015 Search Report issued in European Patent Application No. 14198243.
Jul. 14, 2014 Search Report Issued in British Application No. GB 1400701.7.
Li, Yan et al. "Simulation of Harmonic Armature Reaction in Synchronous Brushless Excitation". 4304-4306. 2011, 2nd International Conference on Artificial Intelligence, Management Science and Electronic Commerce.

* cited by examiner

FAULT DETECTION IN BRUSHLESS EXCITERS

FIELD OF THE INVENTION

The present invention relates to the detection of faults in brushless exciters, for example exciters in brushless synchronous generators; in particular, but not exclusively, to the detection of rectifier diode faults in exciters.

BACKGROUND OF THE INVENTION

The brushless synchronous generator (BLSG) is widely used in aircraft and marine vessels for onboard power generation and it is also used as a shaft generator in energy efficient hybrid propulsion systems for marine vessels. The brushless excitation offers increased reliability and reduced maintenance requirements for the generator.

The exciter is a key component of a generator and the generator's output voltage is regulated by controlling the exciter's field current. The main function of the excitation system is to provide variable DC current to excite the main magnetic field in the rotor. Furthermore, it supports short time overload capability, controlling the terminal voltage with suitable accuracy, ensures stable operation and keeps the machine within permissible operating range.

The exciter machine and the rectifier are mounted on the same shaft as the main alternator. Excitation systems have a significant impact on the generator dynamic performance, availability, quality of generator's voltage and reactive power.

The present invention focuses on detecting a fault in a rotating diode of the rectifier.

Generally, there are two major fault conditions in the rotating rectifier of a brushless excitation system, namely
 i. Open circuit failure
 ii. Short circuit failure The failures could be single-diode failure or multiple-diodes failure, and each could be either short circuit or open circuit fault.

Having removed the need for brushes, commutator and slip rings, direct fault detection in the rotating rectifier in AC brushless exciter becomes very challenging. Nevertheless it is important to detect and react suitably to rotating diode failures.

The output capacity of the exciter is reduced during diode open circuit failure. In this case, the field current increases stress on other devices and also reduce the transient capability of the machine. For this type of failure, the generator is not at any immediate risk of terminal serious damage. Therefore it can continue to operate for a limited time. However, this increases stresses on the other diodes and could lead to further diode failures. Moreover, the voltage regulator could be damaged due to increased excitation.

A diode short circuit is the most frequent failure condition. During diode short circuit, the output of the exciter is severely affected and the main alternator is unable to provide rated voltage without overloading the exciter. Furthermore, a shorted diode is one of the most severe fault conditions, which requires a very large increase in exciter's field current to maintain the alternator voltage. If this fault condition persists, the exciter and/or the voltage regulator could be damaged. In most short circuit diode cases, the generator is forced to shutdown (tripped) to prevent permanent damage to the overall system.

Hence, there is a need to develop suitable fast and accurate methods for detecting such diode failures.

The prior art discloses some techniques for detecting diode failures.

For example, US20110216449 discloses a method and apparatus for fault detection of series diodes in rectifiers, wherein the voltage across one or both of the individual diodes, and/or the voltage across the pair of diodes are measured to determine a voltage ratio. The voltage ratio is then analysed to determine if a diode fault is present. By employing a voltage ratio rather than a fixed threshold, the fault detection can be used at all possible operating voltages, corresponding to machine operating conditions ranging from no load to full load.

The schematic diagram of a synchronous machine with a plurality of diode detection modules and series module connected to a fault detection module are shown in FIG. 1 and FIG. 2 of US20110216449. The transmission of the signal from the rotor to the stator is via a telemetry transmitter module 80 to a telemetry receiver module 90. The transmitter module 80 can sample, digitise and transmit data of the rotating elements, including that of the diode fault detection modules 20A-20F using wireless techniques.

However, this proposed solution uses 12 separate voltage sensors arranged across the pairs of series diodes. These voltage sensors measure the diode voltage and determine the ratio between two of these voltages, which is then analyzed to determine the fault. However this method is complex due to presence of larger number of sensors and due to the presence of series connected diodes.

U.S. Pat. No. 5,453,901 discloses a diode short circuit detection and protection circuit for excitation system of brushless synchronous machine. An RC (resistor-capacitor) circuit is used for detecting AC voltages in an exciter field winding for the purpose of directly operating a circuit breaker to remove excitation to the field windings and supply, temporarily shorting the AC current through the exciter field winding.

Failure of a single diode short circuit can result in hazardous conditions due to generation of high voltages in the exciter field, high current in the exciter armature, and loss of excitation and control.

Thus, ideally, a rapid response of a detection and protection system is required in order to prevent subsequent damage to the exciter windings and the voltage regulator.

In detail, a shorted diode fault would generate a large AC voltage in the field windings, and the protection circuit would respond to the generated AC voltage by temporarily shorting a RC circuit to protect the field winding. The temporary shutdown of the field windings removes all excitation from the generator field, as well as the field supply, which eliminates further damage to the excitation system.

Furthermore, the rotating rectifier adapts a non-standard bridge configuration of parallel-fused diodes redundant topology, which under diode shorted circuit, excessive current will burn the fuse, leaving the redundant branch taking all the rectification purpose, without the need of shutting down the entire generator.

However, in the configuration of U.S. Pat. No. 5,453,901, under normally balanced operating conditions, i.e. in the absence of rotating diode faults, the exciter armature winding shows highly linear but balanced behaviours. Thus, any diode fault emulated will upset the exciter armature winding balanced behaviour immediately. And, the exciter armature winding exhibits highly imbalanced effects due to the loss of rectification at the main field winding. Indeed, the reflected harmonics due to armature reaction effect is seen directly at the exciter armature winding, while exciter field winding will require more time to generate the significant fault signature due to reflected harmonics in the exciter armature winding.

Thus, there is a need for an improvement in the detection of a diode fault in a rotating diode rectifier circuit, e.g. in a brushless exciter, such as that used in a brushless synchronous generator, so that faults can be detected quickly, and preferably with minimal additional burden on, or modification of, the existing circuitry.

SUMMARY OF THE INVENTION

Accordingly, in an aspect, the present invention proposes a method for detecting a fault in an exciter circuit, suitable for use in a brushless induction machine (e.g. a brushless generator), the exciter circuit including (a) an exciter armature winding, having a plurality of armatures, arranged to generate a multiphase AC signal, each armature of the plurality of armatures providing a respective signal component of the multiphase AC signal, and (b) a rectifier circuit for receiving the signal components via the respective armatures, the rectifier circuit comprising a plurality of diodes arranged to rectify the signal components to provide a rectified output signal, wherein the method includes the steps of: acquiring a respective characteristic value for a first characteristic of at least two of the respective signal components; acquiring a respective further characteristic value for a second characteristic of at least two of the respective signal components; calculating the magnitude of the $n^{th}$ order harmonic component for each acquired characteristic value; calculating the magnitude of the $n^{th}$ order harmonic component for each acquired further characteristic value; on the basis of the calculated magnitudes, calculating the $n^{th}$ order harmonic admittance and/or impedance of the rectifier circuit; and determining whether a fault has occurred in the exciter circuit on the basis of the $n^{th}$ order harmonic admittance and/or impedance of the rectifier circuit.

In embodiments, the present invention only needs the acquisition of information about the signal components in at least two armatures to detect a fault in the exciter circuit. So, for example, in an armature winding having three armatures information about two signal components in respective armatures is sufficient to work the present invention. Thus, in order to acquire the necessary information, only a single sensor on at least two armatures may be provided to measure the signal component. Furthermore, no modification of the rectifying circuit is necessary.

However, it may be preferred that the method includes the steps of: acquiring a respective characteristic value for a first characteristic of each of the respective signal components; deriving an $n^{th}$ order harmonic admittance and/or impedance of the rectifier circuit indicative of a relationship between the acquired respective characteristic values; determining whether a fault has occurred in the exciter circuit on the basis of the $n^{th}$ order harmonic admittance and/or impedance of the rectifier circuit. Accordingly, the present invention preferably includes acquiring information about the signal components in each of the armatures to detect a fault in the exciter circuit. So, for example, in an armature winding having three armatures it may be preferred to acquire information about three signal components—one in each armature. Thus, in order to acquire the information, a single sensor on each armature may be provided to measure the respective signal component. Again, no modification of the rectifying circuit is necessary.

This can be contrasted with e.g. US20110216449 which requires on the one hand many more sensors than the present invention, and on the other hand requires modification of the rectifying circuit (to provide a plurality of series connected diodes in each branch of the rectifying circuit).

The present invention is also able to determine a fault in the exciter circuit faster than that achievable by the arrangement in U.S. Pat. No. 5,453,901; the arrangement disclosed therein being an arrangement which is relatively slow to react to faults, for the reasons given above.

In particular, the present invention provides a rapid rotating diode fault detection response by focussing on acquiring measurement data from the exciter armature winding. The exciter armature winding is directly coupled, electrically, with the rotating rectifier. Whereas the exciter field winding, which is used widely in the prior art to try to detect rotating diode faults, is not directly coupled, electrically, with the rotating rectifier. Under normally balanced operating conditions, i.e. in the absence of rotating diode faults, the exciter armature winding shows highly linear but balanced behaviours. Thus, any diode fault will upset the exciter armature winding balanced behaviour immediately. For example, the exciter armature winding exhibits highly imbalanced effects due to the loss of rectification at the main field winding. Thus, the reflected harmonics due to armature reaction effects are "seen" directly at the exciter armature winding, while exciter field winding will require more time to "see" the effects. Hence, this invention is able to provide a fast detection response compared to the prior art, by measuring exciter armature winding parameters rather than exciter field winding parameters.

Indeed, not only does the present invention allow fast and accurate detection of rotating diode faults, but it also allows fast and accurate detection of inter-turn faults, for example an inter-turn short circuit, on one or more exciter armatures of the exciter armature winding.

Each characteristic value and further characteristic value may be indicative of the current flowing in the respective armature. Each characteristic value and further characteristic value may be indicative of a voltage drop measured across a resistor connected in series with the respective armature. Therefore, fewer sensors are required to provide the initial data than in the prior art. Furthermore, the sensors can easily be retrofitted to existing exciter circuits without needing to modify the arrangement of the exciter circuitry, in particular the rectifying circuit.

Each characteristic value may be indicative of the voltage across the respective armature. The $n^{th}$ order harmonic admittance and/or impedance of the rectifier circuit may be derived on the basis of a difference in voltage ratios between the respective armatures. The derived nth order harmonic admittance and/or impedance of the rectifier circuit may be derived on the basis of the magnitude of the difference in voltage ratios between the respective armatures.

Therefore, the computational power required to calculate the $n^{th}$ order harmonic admittance and/or impedance of the rectifier circuit may be low.

The method may further include the steps of: acquiring, for (at least two or) each The step of deriving the $n^{th}$ order harmonic admittance and/or impedance of the rectifier circuit preferably includes the step of calculating the admittance and/or impedance of the rectifier circuit associated with a particular frequency harmonic of the acquired characteristic values and further characteristic values.

The step of deriving the $n^{th}$ order harmonic admittance and/or impedance of the rectifier circuit preferably comprises calculating the third (order) harmonic admittance and/or impedance of the rectifier circuit on the basis of the acquired characteristic values and further characteristic values.

Preferably, the step of calculating the third harmonic admittance and/or impedance includes the steps of: calculating the magnitude of the third harmonic component for each acquired characteristic value; calculating the magnitude of the third harmonic component for each acquired further characteristic value; and, on the basis of the calculated magnitudes, calculating the third harmonic admittance and/or impedance of the rectifier circuit.

Preferably, the third harmonic components are positive sequence components. Preferably, the third harmonic admittance and/or impedance is the positive sequence third harmonic admittance and/or impedance.

Preferably n is a positive integer; even more preferably a positive integer greater than 1.

The step of determining whether a fault has occurred may include the steps of: comparing the calculated $n^{th}$ order harmonic admittance and/or impedance of the rectifier circuit with a predetermined range of known fault values; and determining that a fault has occurred in the exciter circuit if the calculated $n^{th}$ order harmonic admittance and/or impedance of the rectifier circuit lies within the predetermined range of known fault values.

The predetermined range of known fault values may include a first sub-range of known first fault values, and a second sub-range of known second fault values. Accordingly, the method may include the step of determining that a first fault has occurred in the exciter circuit if the calculated $n^{th}$ order harmonic admittance and/or impedance of the rectifier circuit lies within the first sub-range; and/or determining that a second fault has occurred in the exciter circuit if the calculated $n^{th}$ order harmonic admittance and/or impedance of the rectifier circuit lies within the second sub-range, the first and second faults being different types of fault.

The first and second sub-ranges are preferably mutually exclusive sub-ranges. The first and second sub-ranges are preferably consecutive sub-ranges.

The predetermined range of known fault values may include a third sub-range of known third fault values, and the method may include the step of determining that a third fault has occurred in the exciter circuit if the calculated $n^{th}$ order harmonic admittance and/or impedance of the rectifier circuit lies within the third sub-range, the third fault being a different type of fault to the first and second types of fault. Preferably, the first, second and third sub-ranges are mutually exclusive sub-ranges. The second and third sub-ranges are preferably consecutive sub-ranges.

Preferably, a fault is only determined to have occurred if the calculated $n^{th}$ order harmonic admittance and/or impedance of the rectifier circuit lies within the predetermined range of known fault values for a predetermined length of time. Preferably, the fault is only determined to have occurred if the calculated $n^{th}$ order harmonic admittance and/or impedance of the rectifier circuit lies within the first, second or third sub-range for a predetermined length of time.

For example, the method is preferably executed so as to generate, over time, a sequence of $n^{th}$ order harmonic admittance and/or impedance of the rectifier circuits and, preferably, a fault is only determined to have occurred if sequential $n^{th}$ order harmonic admittances and/or impedances of the rectifier circuit lie within the predetermined range of known fault values, e.g. for a predetermined length of time. Preferably, the respective (type of) fault is only determined to have occurred if sequential $n^{th}$ order harmonic admittances and/or impedances of the rectifier circuit lie within the first, second or third sub-range, e.g. for a predetermined length of time. Instead of a predetermined length of time, the determination may be made on the basis of a threshold number of sequentially $n^{th}$ order harmonic admittance and/or impedance of the rectifier circuit.

The step of determining whether a fault has occurred includes the step(s) of: determining whether a fault has occurred in one or more diodes; and/or determining whether an inter-turn fault has occurred in the exciter armature winding.

The first fault may be an open circuit in at least one of the plurality of diodes. The second fault may be a short circuit in at least one of the plurality of diodes. The third fault may be a fault in the exciter armature winding. The third fault may be an inter-turn fault in the exciter armature winding.

The present invention also provides an apparatus arranged to detect a fault in an exciter circuit, suitable for use in a brushless generator, the exciter circuit including an exciter armature winding, having a plurality of armatures, arranged to generate a multiphase AC signal, each armature of the plurality of armatures providing a respective signal component of the multiphase AC signal, and a rectifier circuit for receiving the signal components via the respective armatures, the rectifier circuit comprising a plurality of diodes arranged to rectify the signal component to provide a rectified output signal, wherein the apparatus includes a processor arranged to perform the method as described.

Thus the processor may be arranged: to acquire, for each of at least two signal components, a respective characteristic value for a first characteristic of the signal component; to acquire, for each of at least two signal components, a respective further characteristic value for a second characteristic of the signal component; to calculate the magnitude of the $n^{th}$ order harmonic component for each acquired characteristic value; to calculate the magnitude of the $n^{th}$ order harmonic component for each acquired further characteristic value; on the basis of the calculated magnitudes, to calculate the $n^{th}$ order harmonic admittance and/or impedance of the rectifier circuit; and to determine whether a fault has occurred in the exciter circuit on the basis of the $n^{th}$ order harmonic admittance and/or impedance of the rectifier circuit.

The processor may be further arranged to determine the type of fault in the exciter circuit on the basis of the $n^{th}$ order harmonic admittance and/or impedance of the rectifier circuit.

The apparatus may further include a respective sensor to provide each characteristic value or further characteristic value by measuring the signal in the respective armature. The processor may be therefore arranged to acquire the characteristic value and further characteristic values from the respective sensors.

The processor may be arranged to calculate the third harmonic admittance and/or impedance of the rectifier circuit on the basis of the acquired characteristic values and further characteristic values. When calculating the third harmonic admittance and/or impedance the processor may be further arranged: to calculate the magnitude of the third harmonic component for each acquired characteristic value; to calculate the magnitude of the third harmonic component for each acquired further characteristic value; and on the basis of the calculated magnitudes, to calculate the third harmonic admittance and/or impedance of the rectifier circuit.

The harmonic components may be the positive sequence components; and the calculated harmonic admittance and/or impedance may be the positive sequence harmonic admittance and/or impedance.

When determining whether a fault has occurred the processor may be arranged: to compare the calculated $n^{th}$ order harmonic admittance and/or impedance of the rectifier circuit with a predetermined range of known fault values; and to determine that a fault has occurred in the exciter circuit if the $n^{th}$ order harmonic admittance and/or impedance of the rectifier circuit lies within the predetermined range of known fault values.

The predetermined range of known fault values preferably includes a first sub-range of known first fault values, and a second sub-range of known second fault values; and the processor is preferably further arranged to determine that a first fault has occurred in the exciter circuit if the calculated $n^{th}$ order harmonic admittance and/or impedance of the rectifier circuit lies within the first sub-range; and/or to determine that a second fault has occurred in the exciter circuit if the calculated $n^{th}$ order harmonic admittance and/or impedance of the rectifier circuit lies within the second sub-range, the first and second faults being different types of fault.

The predetermined range of known fault values preferably includes a third sub-range of known third fault values, and the processor is preferably further arranged to determine that a third fault has occurred in the exciter circuit if the calculated $n^{th}$ order harmonic admittance and/or impedance of the rectifier circuit lies within the third sub-range, the third fault being a different type of fault to the first and second types of fault.

The processor is preferably arranged to execute repeatedly, over time, the acquiring, deriving and determining operations to generate a series of $n^{th}$ order harmonic admittances and/or impedances of the rectifier circuit; and the processor is preferably further arranged to determine that a fault has occurred only if a plurality of the generated series of $n^{th}$ order harmonic admittance and/or impedance of the rectifier circuit lie within the predetermined range of known fault values within a predetermined length of time.

When determining whether a fault has occurred the processor is arranged: to determine whether a fault has occurred in one or more diodes of the plurality of diodes; and/or to determine whether an inter-turn fault has occurred in the exciter armature winding. The processor is preferably further arranged to determine the type of diode fault in the one or more diodes determined to have suffered a fault.

The process of acquiring the respective characteristic values for a first characteristic of the signal components, as performed by the processor, may include acquiring a respective characteristic value for a first characteristic of the signal component in each of the respective armatures.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES OF THE INVENTION

Figure 1:
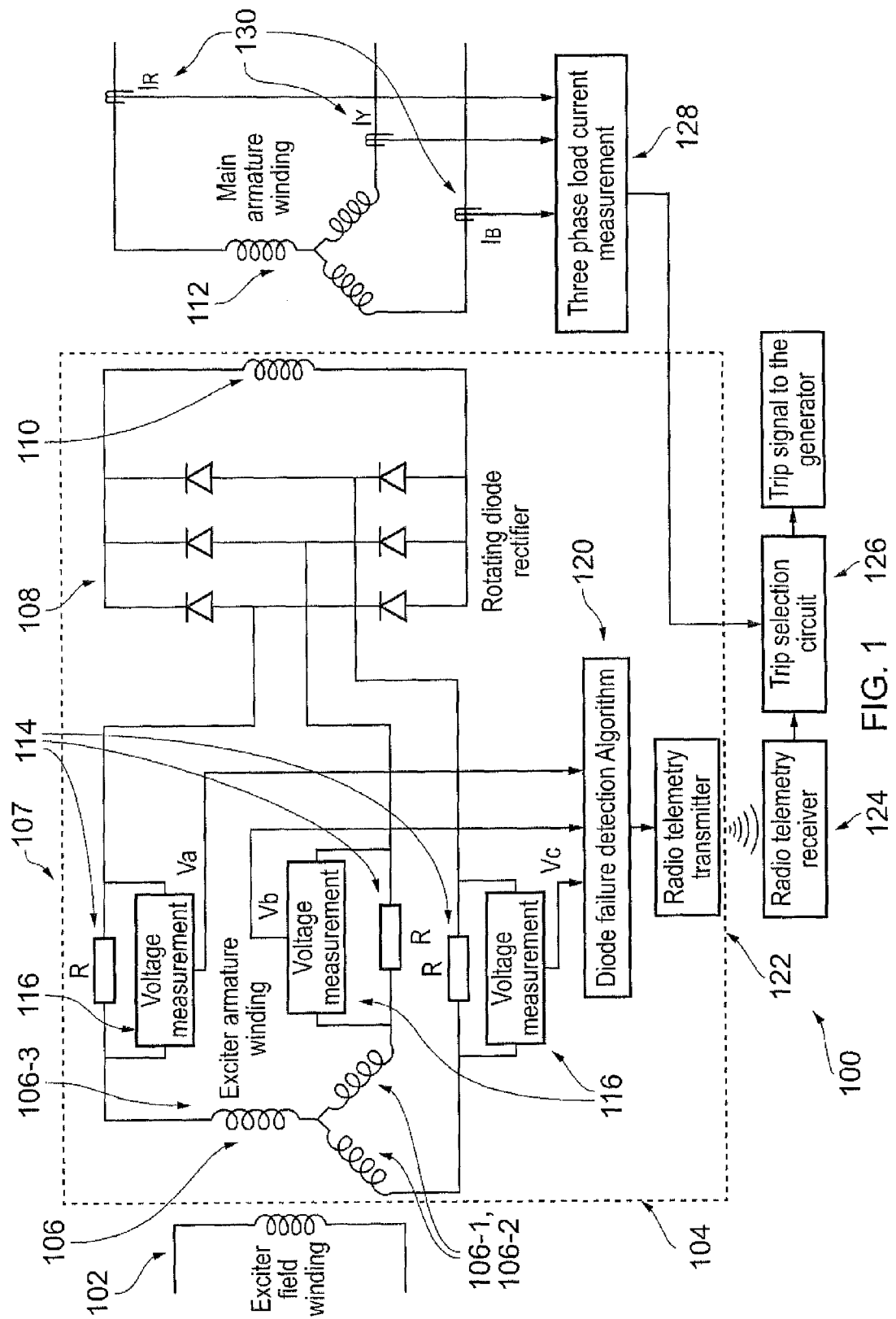
FIG. 1 shows a BLSG including an embodiment of the present invention.

Fundamentally, in a synchronous generator a DC current is provided for a field winding (or coil) mounted on a rotor, so as to produce a rotor magnetic field. The rotor is then rotated about its axis, e.g. by external means. Thus, sometimes the rotor magnetic field is referred to as a rotating magnetic field.

A stator is provided with a stator winding (or coil). As the rotor is rotated the rotating magnetic field induces a current (via an electromotive force) in the stator winding. Typically, the stator winding has a plurality of armatures, whereby the rotating magnetic field induces respectively different currents in each armature at different parts of the cycle. Thus, the multi-armature stator winding will generate a multiphase (or polyphase) output in accordance with the number of armatures and the spatial relationship between each armature and the rotating magnetic field.

The DC current can be provided to the rotor field winding by means of brushes and slip rings. However, in a brushless synchronous generator, the DC current is provided by a supply circuit mounted on the rotor itself. The supply circuit is typically an AC signal rectifying circuit, for supplying a rectified signal to the rotor field winding. Typically, the supply circuit is provided with an AC signal from an exciter (armature) winding, also located on the rotor. The exciter winding has a current induced in it (via an electromotive force) by an exciter field winding located on the stator. The exciter field winding is supplied with a DC current. Thus, as the rotor is rotated, the current is induced in the exciter (armature) winding.

Typically, the exciter (armature) winding includes a plurality of armatures, thereby supplying the AC signal rectifying circuit with a multiphase AC signal. Most exciter armature windings are arranged to provide a 3-phase signal to the AC rectifying circuit.

Accordingly, a respective rectifying sub-circuit (or branch) is provided by the AC rectifying circuit for each phase of the overall output of the exciter armature winding, and a single output is provided for the rotor field winding.

The output of the AC rectifying is ideally DC. However, in practice, the output is not a pure DC signal. It is an approximation of a DC signal based on the frequency and phases of the respective armature outputs of the exciter armature winding received by the AC rectifying circuit.

Typically, the AC rectifying circuit comprises a plurality of diodes suitably arranged to rectify the signals output by the armatures of the exciter armature winding. A fault in one or more diodes is therefore problematic, as it can strongly affect the nature of the DC signal fed to the rotor field winding.

The principal components of a brushless synchronous generator to which the present invention is applicable are common to the embodiments and aspects of the invention as described herein. They will be described here once, for the sake of brevity, with reference to FIG. 1, which shows a brushless synchronous generator incorporating an embodiment according to the present invention.

The generator 100 includes an exciter field winding 102 located on a stator (not shown). Rotor element 104 includes an exciter armature winding 106. Armature winding 106 typically includes a plurality of armatures, so as to output a multiphase (or polyphase) AC signal, with a respective phase component, of the multiphase output, being provided by each armature.

For example, in FIG. 1 exciter armature winding 106 includes three armatures, each generating a respective phase component of the overall signal output by the exciter armature winding 106. In other words exciter armature winding 106 outputs a three-phase AC signal (current).

Each armature 106-1, 106-2, 106-3 feeds a respective component (respectively different in phase) of the AC signal to a respective rectifying sub-circuit (or branch) of AC rectifying circuit 108. AC rectifying circuit 108 is mounted on rotor 104, and may thus be referred to as a rotating rectifier circuit. The individual diodes therein may be referred to as rotating diodes.

The rectified outputs from each branch of the AC rectifying circuit combine to provide a rectified output signal (from the rectifying circuit 108) to the main field winding 110 located on the rotor 104. Rotation of the rotor, and therefore of the main field winding 110, induces a current in the stator main armature winding 112.

The stator main armature winding 112 typically includes a plurality of armatures, thereby generating a multiphase output signal. For example, in FIG. 1 stator main armature winding includes three armatures, arranged to generate a three phase output signal in a similar way to which the exciter armature winding 106 generates a three phase output signal.

An exciter circuit 107 can be defined as including the exciter armature winding 106 and the rotating rectifier circuit 108 (but not the rotor field winding 110). In the example shown, the exciter circuit 107 is a three phase circuit, in that the exciter armature winding includes three armatures arranged to generate a respective phase component of the overall AC signal output by the exciter armature winding.

Thus, the exciter circuit 107 is a (three phase) balanced circuit during normal operation of the rotating diodes. However, the present inventors have realised that a rotating diode failure introduces an imbalance in the exciter armature winding due to an imbalance in the respective currents flowing in the armatures. The present invention takes advantage of this imbalance to detect rotating diode failures.

In embodiments, the present invention proposes fast (responsive) and accurate methods to detect rotating diode faults (failures) and proposes a circuit arrangement to measure and extract the fault signature which provides the fast and accurate rotating diode failure detection.

In embodiments, the present invention also proposes a fast (responsive) and accurate method to detect inter-turn faults in the exciter armature winding, and a circuit arrangement to measure and extract the fault signature which provides the fast and accurate inter-turn fault detection.

FIG. 1 shows a first embodiment of the present invention applied to a brushless synchronous generator 100, as described above.

A respective small resistor 114 is connected in series with each armature (phase) of exciter armature winding, as shown. The measured voltage drop across each resistor, e.g. measured by respective voltage sensors 116, is used to derive an exciter fault (failure) indication signal based upon the algorithm/methodology proposed herein. In particular, the exciter fault (failure) may be a rotating diode fault (failure).

In embodiments, the acquired data (the measured voltage drops) are processed according to the proposed algorithm/methodology, e.g. by a processor 120, and a final control signal is optionally transferred to the stator through a rotating radio telemetry transmitter 122 in order to control the operation of the generator.

For example, a stationary receiver 124 can optionally be used to collect the control signal from the rotor transmitter. The receiver 124 may issue the control signal, or a command signal corresponding to the control signal, to a trip selection circuit 126 for judging whether or not to trip the generator.

In general, the proposed algorithm/methodology of this first embodiment involves calculating (e.g. the modulus or absolute value of) the difference in voltage ratio between the measured voltage drops across the resistors. The voltages drops across the resistors can be denoted as Va, Vb & Vc. An example of the modulus of the difference in voltage ratio between the measured voltage drops across the resistors is MOD(Va/Vb−Vb/Vc).

According to a preferred aspect of the proposed algorithm/methodology, if the ratio is within predetermined values (e.g. with a predetermined range), then it can be said that the rotor exciter circuit 107 is operating normally; in particular that the rectifying circuit 108 is operating normally.

However, if the ratio exceeds one or more threshold values, then it can be said that there is a fault or failure in the exciter circuit 107; in particular in the rectifying circuit 108—specifically, one or more of the rotating diodes. The proposed algorithm/methodology can therefore be used to detect e.g. a rotating diode fault or failure in the rotating rectifying circuit 108 within a very short period of time compared with existing prior art methods.

Optionally, the generator load current ($I_R$, $I_Y$, $I_B$) in each armature of the main armature winding 112 is measured (the measurement data may be collated by a three phase load measurement unit 128) and monitored to avoid nuisance tripping of the generator via the algorithm/methodology outlined above due to generator load changes. This is described below.

Advantageously, in this embodiment, the present invention uses only three sensors, each mounted on a respective exciter armature. A single wireless control signal can be passed to the stator during rotating diode fault or failure. This greatly reduces the number of sensors and reduces the number of transmitting signals of the rotor. Fewer signals to the controller lead to lower computational complexity hence low power consumption.

The proposed detection method provides a very fast detection method due to direct measurement of exciter armature series connected resistance voltage drops. Advantageously, this embodiment is suitable for low and medium power machines.

Figure 2:
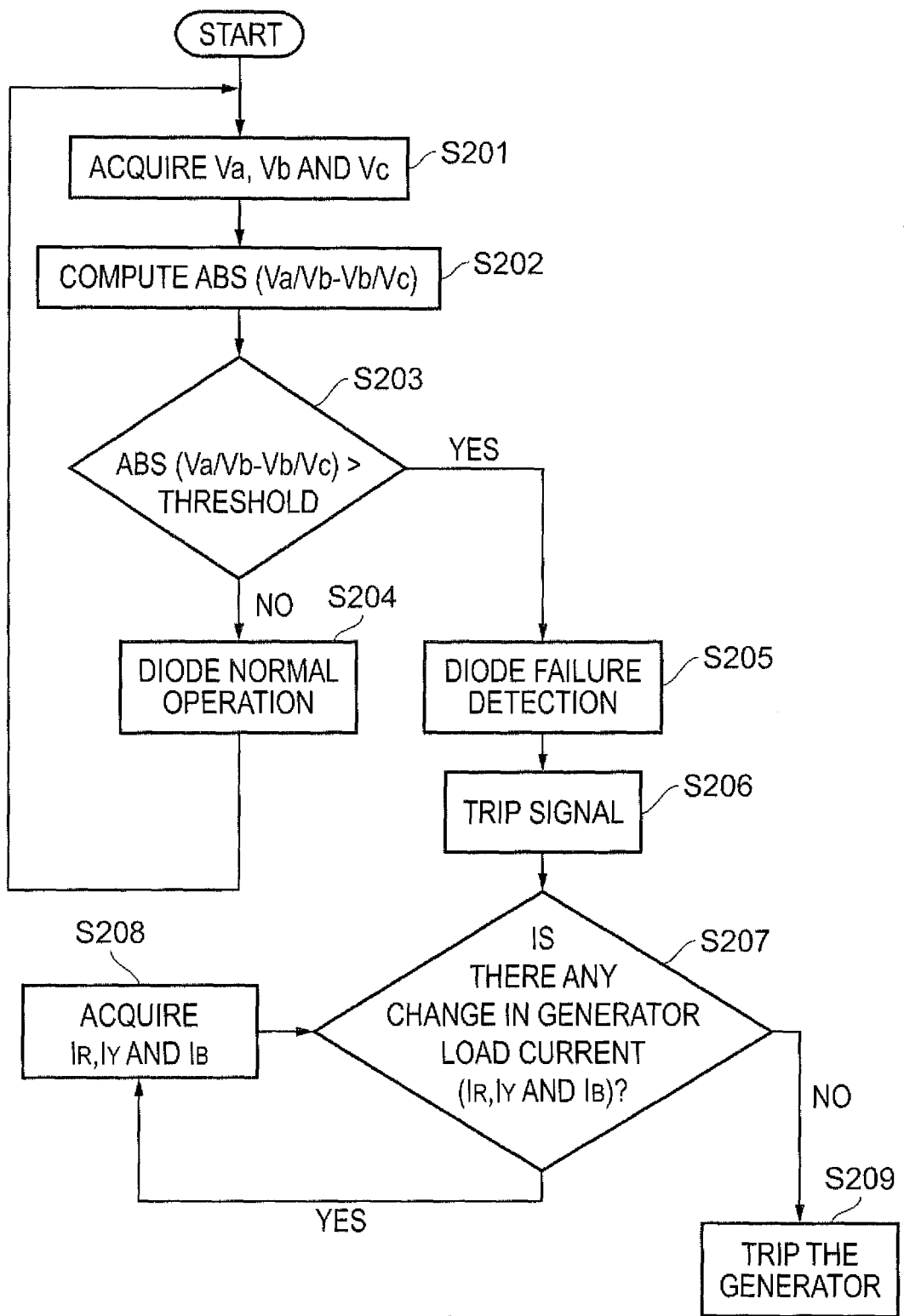
FIG. 2 shows a flowchart representative of process embodying the present invention.

FIG. 2 shows a flowchart outlining the proposed algorithm/methodology.

In S201, the measured voltage drops Va, Vb and Vc are acquired, e.g. by the processor 120 executing the proposed algorithm/methodology. For example, the voltage sensors 116 may issue a measurement signal to the processor 120 which is indicative of the value of the measured voltage drop.

In S202, the modulus of a difference ratio of the voltage drops is calculated, typically by the processor 120. The specific equation chosen to produce the difference voltage ratio is not important. In other words, alternative equations to that provided above may be used to calculate the difference voltage ratio between the armatures of the exciter armature winding 106.

Nevertheless, it may be beneficial, but not necessarily essential, to calculate the modulus of the chosen difference voltage ratio, so that a positive value is acquired in S202 for comparison with threshold values and/or a range later.

In S203 a judgement is made as to whether or not the result obtained in S202 indicates whether a failure, or a fault, exists in the exciter circuit 107. Specifically, a judgement may be made as to whether or not the result (the value) obtained in S202 indicates whether a failure, or a fault, exists in one or more diodes of the rectifying circuit 108.

This judgement is typically made with reference to a threshold value. For example, it may be judged in S203 whether or not the result obtained in S202 exceeds a threshold value which is indicative of a fault in the exciter circuit 107, for example a fault in the rectifying circuit 108.

Thus, if the result exceeds the threshold value, then a determination is made at S205 that the exciter circuit 107 has suffered a fault or failure; specifically, it is determined that one or more rotating diodes have suffered a fault.

However, if the result obtained in S202 does not exceed the threshold value according to the judgement in S203, then a determination may be made in S204 that a fault has not occurred; in particular, that one or more rotating diodes have not suffered a fault. In other words, the determination may be that the rotating diodes, and/or the exciter circuit 108 as a whole, are operating normally. The process may thereafter return to S201 to repeat the analysis.

It should be noted here that in this embodiment, and all other embodiments, the determination that a fault exists (or does not exist) may not be made on the basis of a calculated value derived from a single measurement of the parameters of a signal in the exciter armature winding (e.g. the current voltage therein). Rather, in all embodiments, it may be preferred that the determination is made only when a plurality of calculated values (derived from ongoing measured data) meet the requirements of the particular embodiment. For example, the determination may only be made when a plurality of calculated values (derived from ongoing measured data), meet the requirements of the particular embodiment over a predetermined length of time. Indeed, the determination may only be made when all the values calculated over a predetermined length of time meet the requirements of the particular embodiment. Taking this approach typically helps to eliminate a false positive determination of a fault on the basis of instantaneous anomalous effects measured in the exciter circuit.

Optionally, in the event that a fault is determined in S205, a trip signal may be issued at S206 to trip the generator 100 out of operation so as to prevent damage to the generator. For example, although not shown, trip signal issued at S206 may lead directly to S209, and to a trip of the generator.

However, as another optional feature, the load current in main armature winding 112 may be acquired at S208. For example, the current in each armature of main armature winding 112 may be measured by current sensors 130. The measurements may be made on a continuous basis, or they may be triggered by a positive determination at S205, for example.

To avoid unwanted tripping of the generator by a false positive determination of a fault at S205 (even though this is very unlikely), at S207 a determination is made as to whether or not a change in generator load has occurred, and whether or not the change is likely to have led to the positive determination at S205.

If the determination at S207 is that no such change has been measured, then the generator is typically tripped at S209.

However, optionally, if the determination is that such a change has been measured, then the determination at S207 may be to re-acquire the main armature winding currents and perform the determination at S207 again.

A simulation model of the brushless synchronous generator (BLSG) 100 has been developed to include an exciter circuit having a rotating rectifier circuit. To illustrate the effectiveness of the present invention, a description will now be given of FIGS. 3, 4 and 5 in which the proposed algorithm/methodology is shown to be verified by the simulation model, in a MATLAB/Simulink environment.

Figure 3:
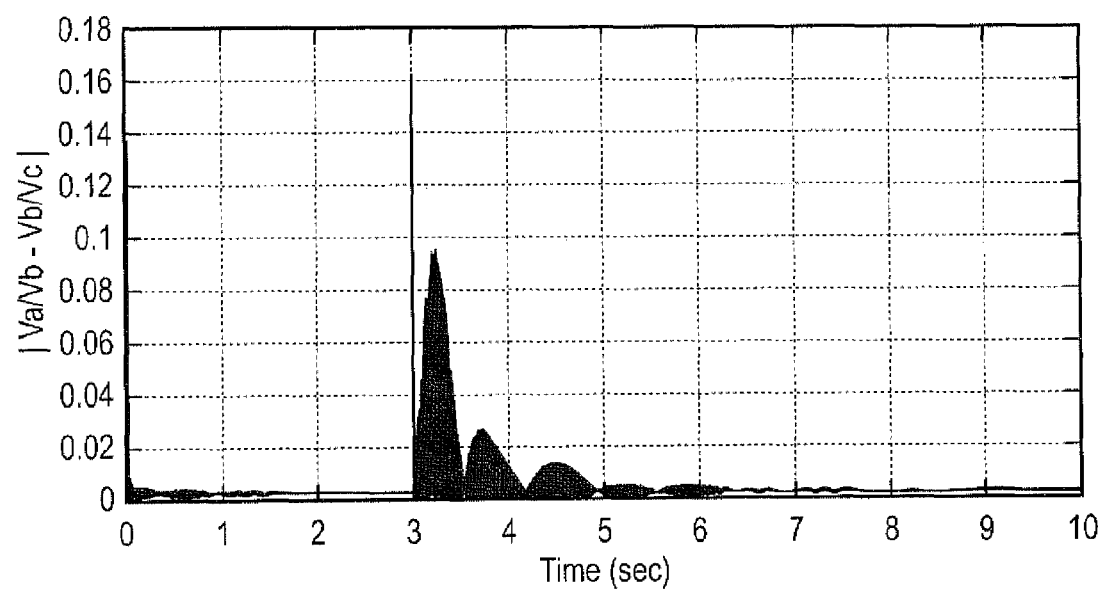
FIG. 3 shows a voltage ratio difference plot for voltage measurements taken according to the embodiment of the present invention shown in FIG. 1 for healthy rotating diodes.

FIG. 3 shows the variation of modulus voltage ratio difference with respect to time during load changes with normal operation of a (non-faulty) rotating diode rectifier circuit 108. From the simulation results, it is observed that the voltage ratio fluctuates during load changes, and may in some cases cause a nuisance trip. Hence, the main armature winding current may optionally be measured and analysed as described above.

Figure 4:
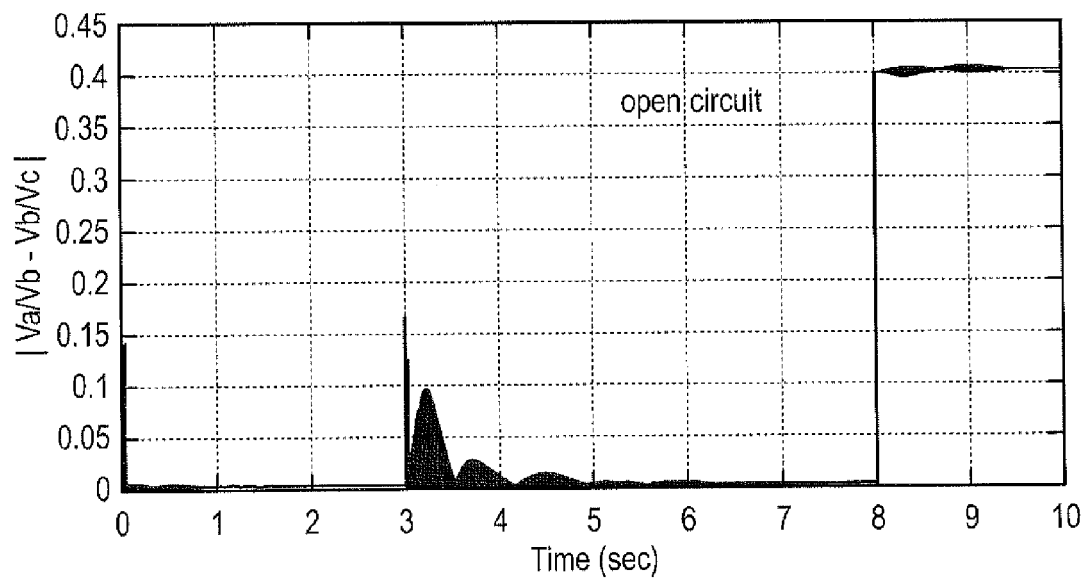
FIG. 4 shows a voltage ratio difference plot for voltage measurements taken according to the embodiment of the present invention shown in FIG. 1 for an open circuit rotating diode fault.

FIG. 4 shows simulation result of the same modulus of the voltage ratio difference with one open circuited diode. The diode open circuit fault is emulated at t=8 seconds and failure detection is possible within a very short period of time due to direct measurement of voltage drop on the exciter armatures—in this embodiment via the small resistors.

Figure 5:
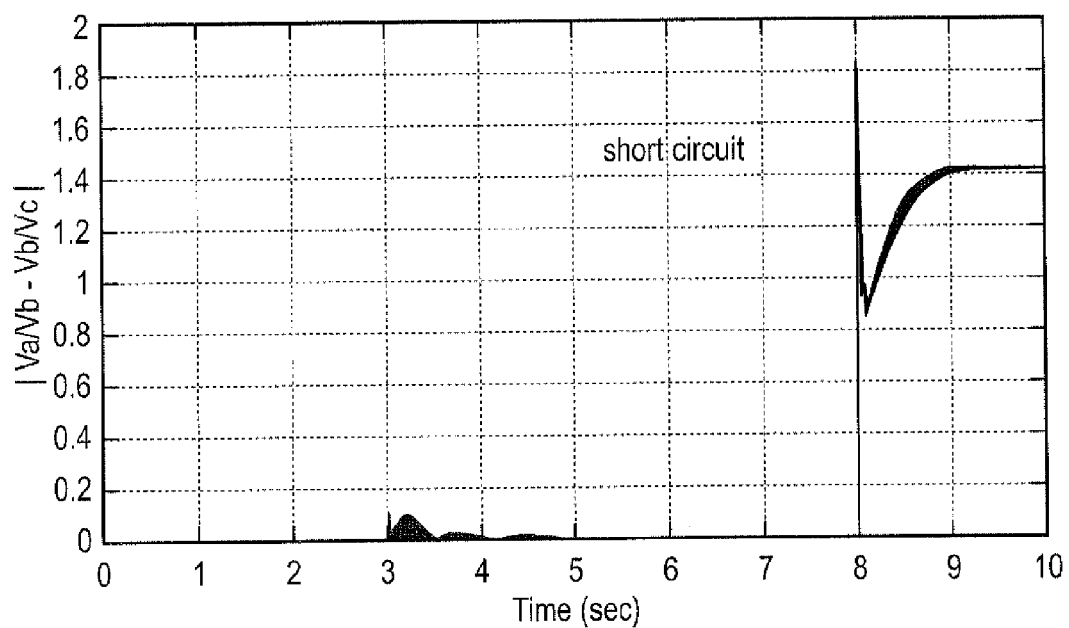
FIG. 5 shows a voltage ratio difference plot for voltage measurements taken according to the embodiment of the present invention shown in FIG. 1 for a short circuit rotating diode fault.

FIG. 5 shows the same modulus of the voltage ratio difference with one short circuited diode. The diode short circuit is emulated at t=8 seconds and failure detection is possible within a very short period after diode failure due to direct measurement of voltage drop on the exciter armatures—in this embodiment via the small resistors.

It will be noted that both FIG. 4 and FIG. 5 also include a reproduction of the plot shown in FIG. 3, at around t=3 seconds. As can be seen, the signal level after t=8 seconds is considerably higher in both FIG. 4 and FIG. 5 compared with FIG. 3. Therefore, it is possible to select a suitable threshold level, above which it can be said that a rotating rectifier diode has experienced a fault (or a failure).

Figure 6:
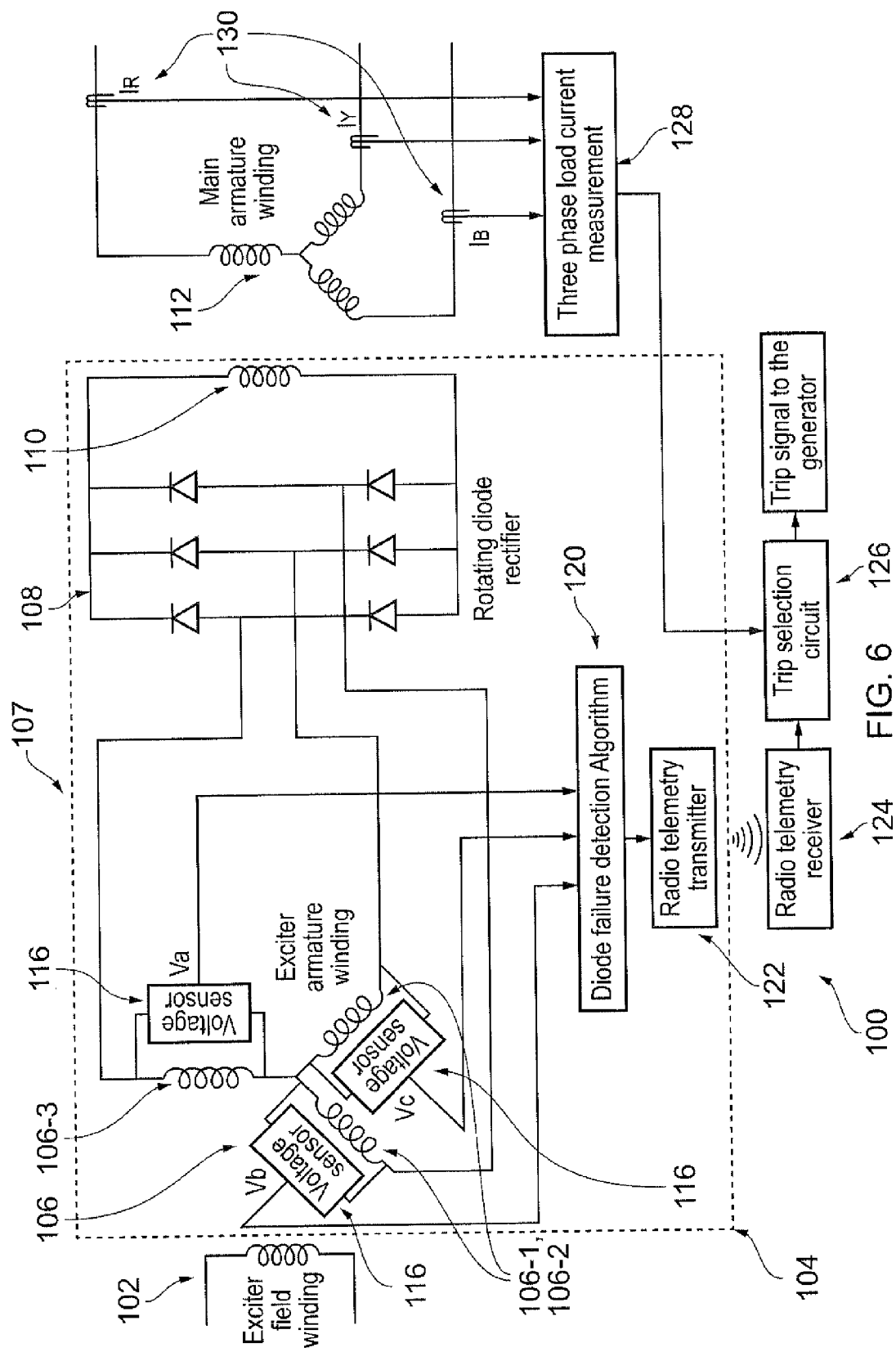
FIG. 6 shows a BLSG including another embodiment of the present invention.

In a second embodiment, the (modulus) voltage ratio difference between the exciter armatures can be obtained by measuring the respective voltage across each exciter armature itself, for example as shown in FIG. 6, instead of across small resistors arranged in series with the armature as was described with reference to the first embodiment and FIG. 1.

Thus, voltage sensors can be used to sense the change in voltage of the exciter armature windings due to the fault seen at the rotating rectifier, and faults can be detected according to the algorithm/methodology described above with reference to FIG. 2.

A third embodiment takes an alternative, albeit similar, approach to detect e.g. rotating diode failures in brushless exciters. The circuit configuration may be similar to that of the first embodiment.

Figure 7:
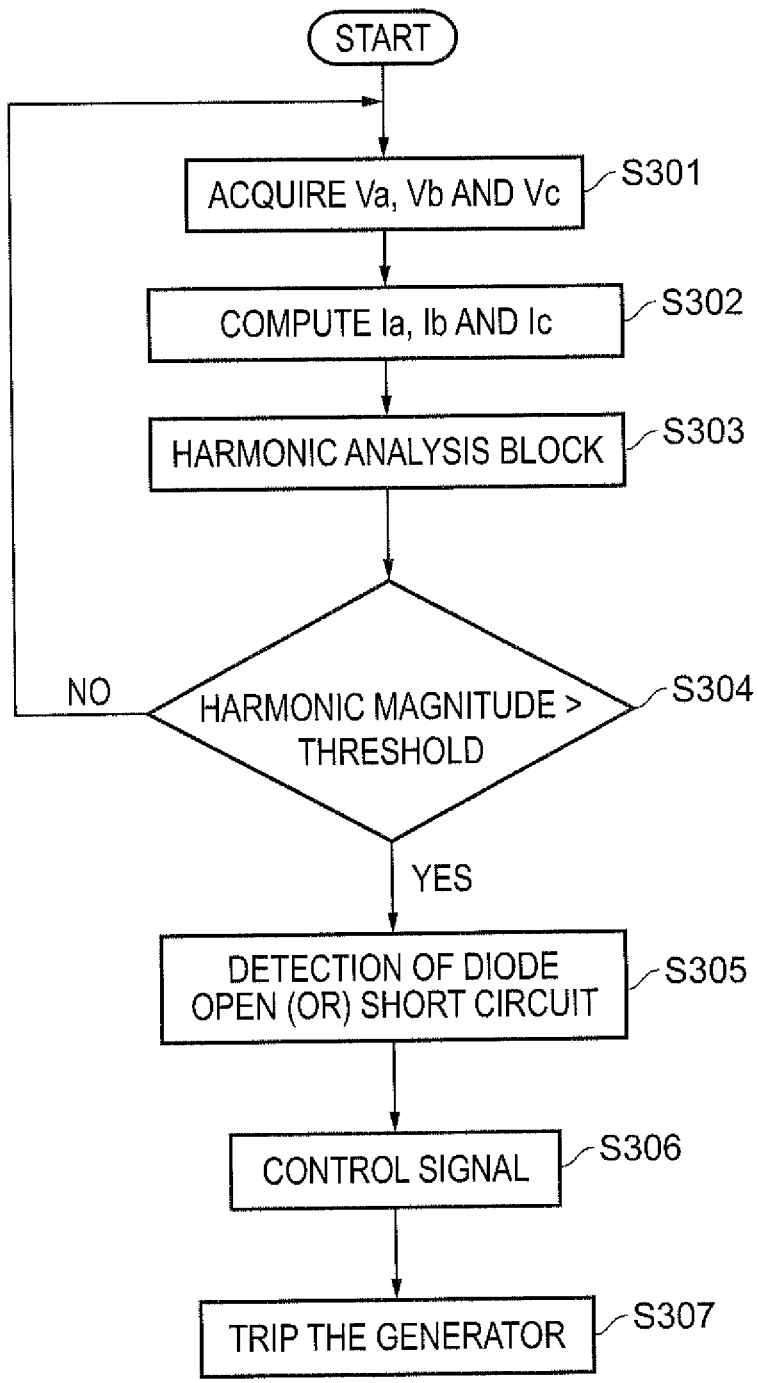
FIG. 7 shows a flowchart representative of another process embodying the present invention.

However, the methodology of the third embodiment, as illustrated in FIG. 7, is different to that of the first embodiment (and second embodiment). Instead of calculating a value based on a relationship between the voltage drops acquired for each armature, the current in each armature is analysed.

In this third embodiment, in order to detect the fault, e.g. the open or short circuit diode fault, the currents ($I_a$, $I_b$ and $I_c$) in the respective exciter armatures 106-1, 106-2 and 106-3 are analysed with reference to a threshold value.

So, for example, S301 may be similar to S201. However in S302, the armature currents $I_a$, $I_b$ and $I_c$ are calculated, for example using the following equations: Ia=Va/R, Ib=Vb/R and Ic=Vc/R.

In S303 harmonic analysis of the armature currents is performed, for example as discussed below in more detail.

In S304 the result of the harmonic analysis is compared with a (predefined) threshold value, similarly to that described for S203 above to establish whether or not a fault has occurred.

In the event that a determination is made that the result of S303 does not exceed the (predefined) threshold, then in S305 a judgement may be made that there is no fault in the exciter circuit 107; specifically that there is no fault in a rotating diode of the rectifying circuit 108. The process may then return to S301.

However, in the event that a determination is made that the result of S303 exceeds the (predefined) threshold, then in S305 a judgement is made that a fault exists in the exciter circuit 107, for example in one or more rotating diodes of the rectifying circuit 108.

S306 and S307 may then proceed similarly to S206 and S209 as described above.

Thus, through the use of harmonic analysis of the armature currents, open circuit or short circuit diode faults can be determined. In particular, the harmonic analysis of $I_a$, $I_b$ and $I_c$ waveforms are performed to detect the diode failures.

In a fourth embodiment, the methodology to determine whether or not a fault has occurred in the exciter circuit, in particular in the rectifying circuit 107, is similar to that of the third embodiment. Namely, the current flowing in each respective exciter armature is analysed to determine if the fault has occurred.

However, dissimilarly to the third embodiment, in this fourth embodiment the current in each armature is acquired directly by measurement, rather than by measuring a voltage drop across small dedicated series resistors respectively arranged in each armature and using the measured voltage drops to calculate the currents in the respective armatures.

Figure 8:
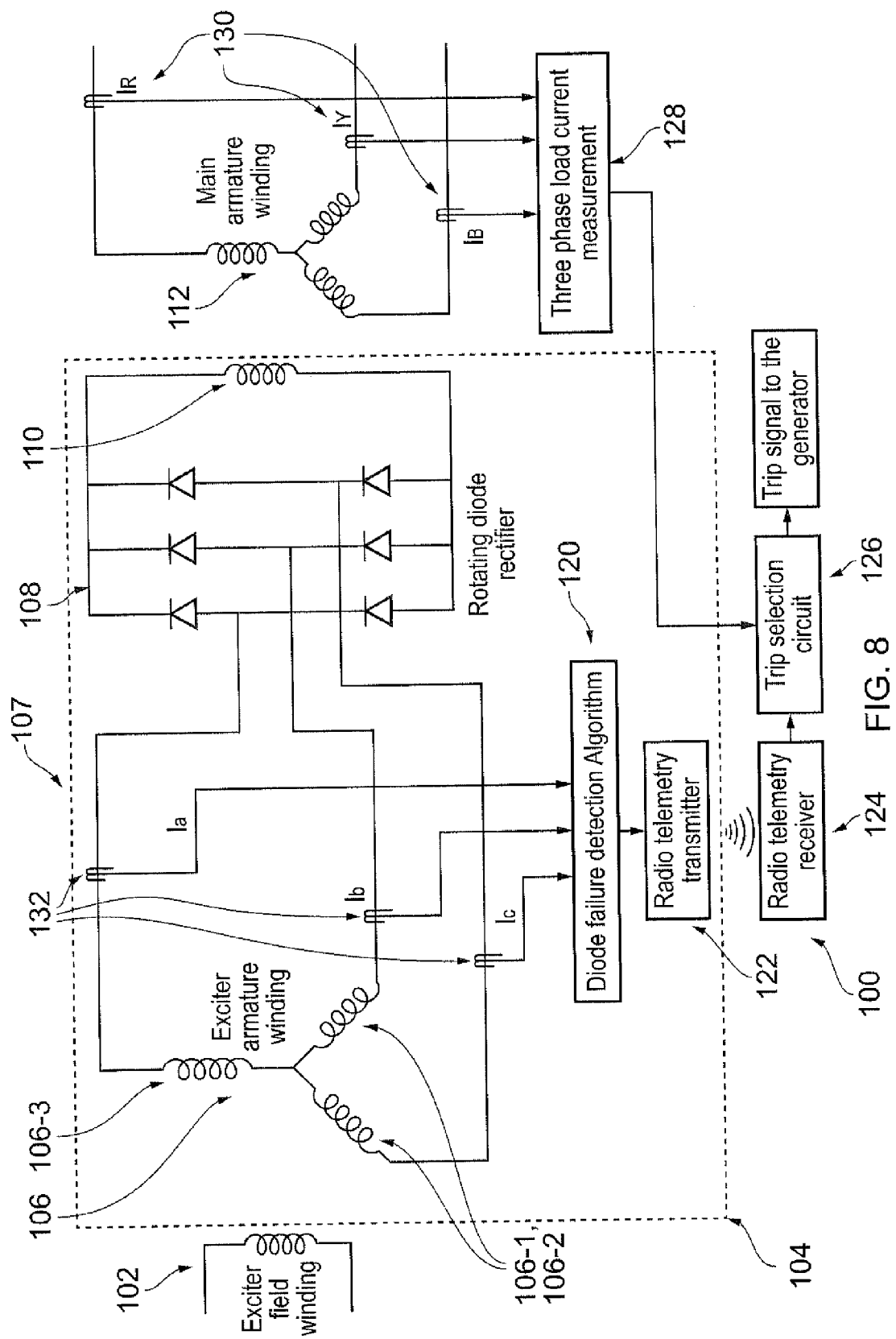
FIG. 8 shows a BLSG including another embodiment of the present invention.

FIG. 8 shows the fourth embodiment of the present invention, in which respective current sensors 132 are arranged to measure the current flowing in each armature.

Through harmonic analysis (similar to that of the third embodiment and as described below) of the measured exciter armature currents, the open circuit or short circuit diode fault can be detected.

An example of the harmonic analysis will be discussed below in more detail.

Figure 9:
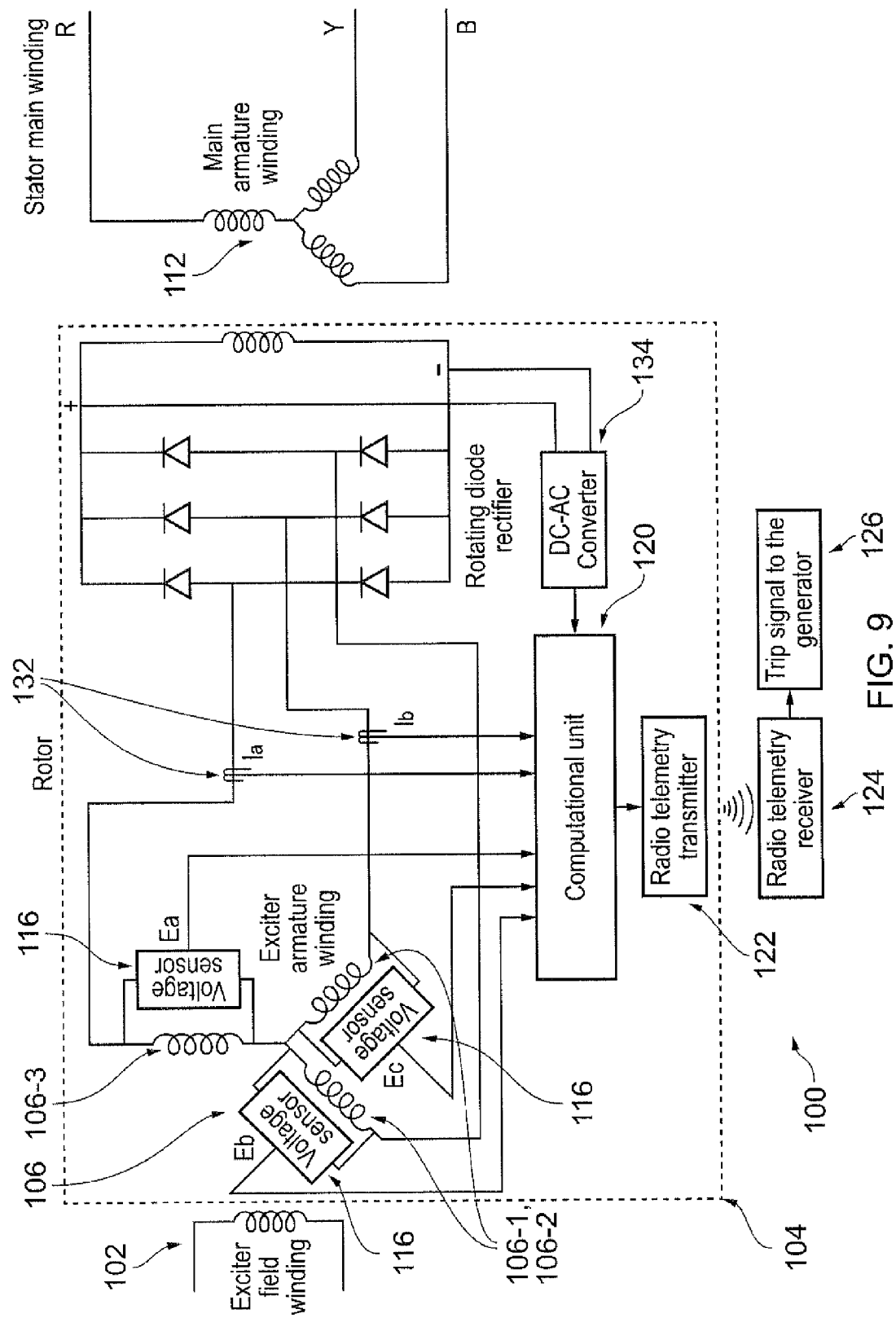
FIG. 9 shows a BLSG including another embodiment of the present invention.

In a fifth embodiment, three voltage sensors 116 are used to measure the respective voltages of each exciter armature 106-1, 106-2 and 106-3, similarly to the second embodiment. Two self-powered current sensors 132 are also used to measure the line currents of two of three exciter armatures, e.g. as shown in FIG. 9. Current sensors 132 may be similar to those shown in FIG. 8 for example.

Computational unit 120 (equivalent to processor 120) is provided to perform the algorithm/methodology for determining whether or not exciter circuit 108, specifically rectifying circuit 108, suffers from a fault.

DC-DC converter 134 may optionally be connected across the main field winding to supply power to the computational unit 120. Thermo electric generators may be used to generate electrical power from the heat energy available in the BLSG. For example, the heat energy harvested from the diode heat sink, bearing and self-powered current sensors may also be used to supply power to the computational unit 120 if desired. It is to be noted that these optional features for supplying power, e.g. to the computational unit 120, could be applied to any embodiment.

In this embodiment, both the measured exciter winding phase voltages and the measured line currents are used to derive a rotating diode failure indication signal based upon the algorithm/methodology of this embodiment, which will be discussed in detail below.

The circuit shown in FIG. 9 consists of exciter armature winding 106, and the rotating rectifier 108 is a three phase balanced exciter circuit 108 during normal operation of the rotating diodes. However, as previously discussed, the diode open or short circuit failure introduces an imbalance in the exciter armature winding 106 and generates imbalance currents in the respective armatures 106-1, 106-2 and 106-3. However, this embodiment is based on the analysis of the positive sequence third harmonic components of the exciter armature voltages and currents. In particular, in this embodiment the positive sequence third harmonic admittance of the rotating rectifier failure is calculated in order to provide a means of fast detection of rotating diode fault (or failure), such as open circuit or short circuit.

However, just as for the other embodiments, this embodiment also provides a means for the fast detection of inter-turn faults in the exciter armature winding, in particular inter-turn short circuits.

In accordance with the present embodiment, the positive sequence third harmonic admittance is calculated based on the ratio of the measured positive sequence third harmonic currents and voltages.

The calculated positive sequence third harmonic admittance is then used according to the proposed algorithm/methodology to determine whether or not a failure has occurred in the exciter circuit 107, in particular in one or more of the rotating diodes.

If the calculated positive sequence third harmonic admittance is within predetermined values (e.g. below a predefined threshold), then the exciter circuit 107 is judged to be operating normally, in particular, the rotating diodes are judged to be operating normally. If the calculated positive sequence third harmonic admittance is found to exceed a predefined threshold, then the exciter circuit 107 is judged to be suffering a fault; in particular, one or more rotating diodes are judged to be suffering a fault.

For example, if the calculated positive sequence third harmonic admittance is found to be between the values of "threshold 1" and "threshold 2", e.g. for a predetermined time, then the exciter circuit 107 is judged to be suffering from a fault; in particular, one or more of the rotating diodes is judged to be suffering from a fault. Specifically, one or more of the rotating diodes is judged to be suffering from an open circuit failure.

If the calculated positive sequence third harmonic admittance exceeds both threshold values "threshold 1" and "threshold 2", e.g. for more than a predetermined time, then the exciter circuit 107 is judged to be suffering from a fault, in particular, one or more of the rotating diodes is judged to be suffering from a fault. Specifically, one or more of the rotating diodes is judged to be suffering from a short circuit failure.

Generally, the measured voltages and line currents are processed according to the proposed algorithm/methodology by the computational unit. Depending on the determination of whether or not a fault has occurred in the exciter circuit 107, a control signal may optionally be transferred to a stator telemetry receiver 124 through the rotating telemetry transmitter 122.

Stator receiver 124 may issue the control signal, or a corresponding command signal 126, to order the generator to be tripped as a consequence of the determination of a fault (failure) being determined to have occurred in the exciter circuit 107.

Figure 10:
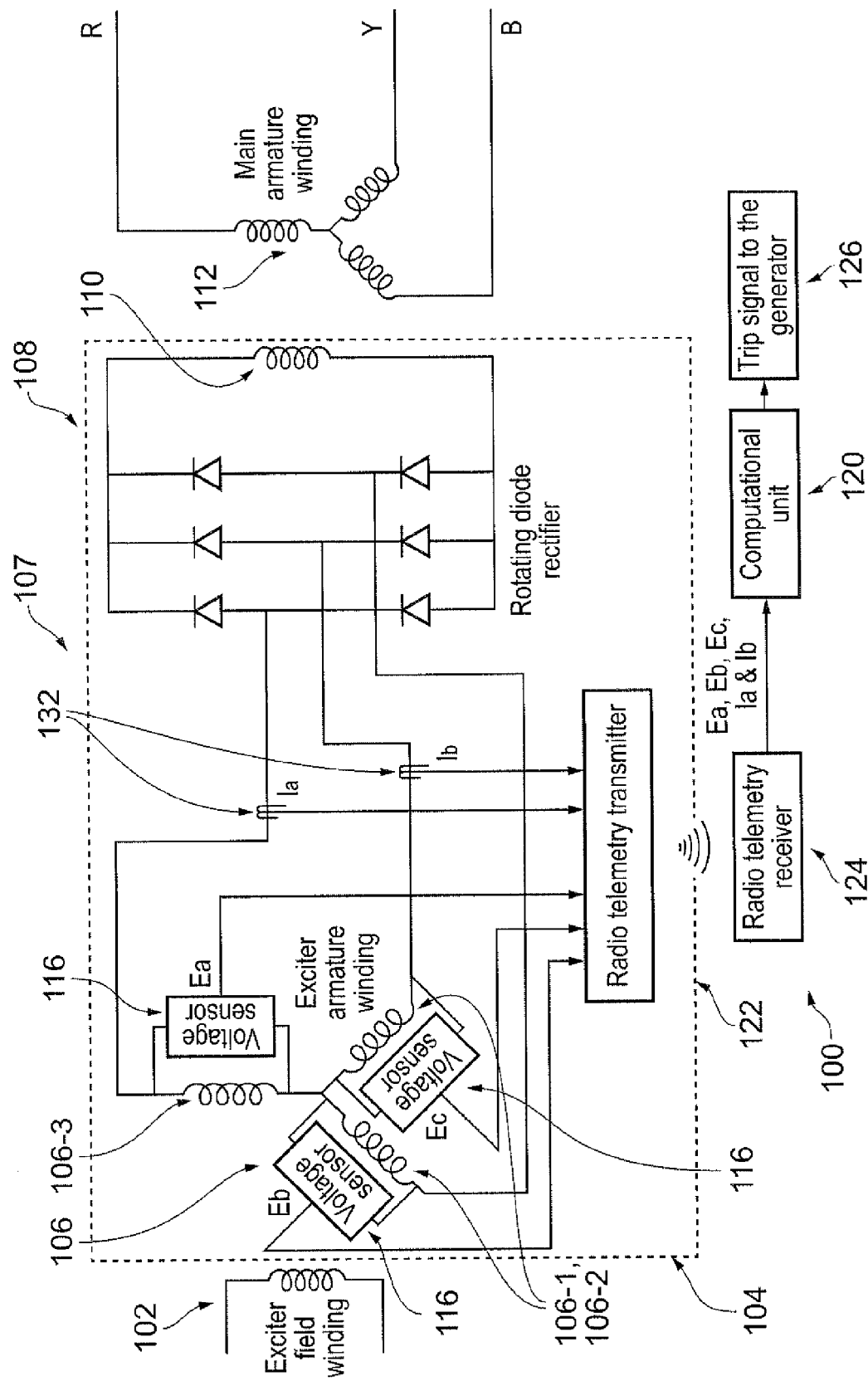
FIG. 10 shows a BLSG including another embodiment of the present invention.

FIG. 10 shows an optional modification, in which the computational unit 120 is located off the rotor, on the stator. In this modification the rotor telemetry transmitter 122 transmits information detailing the measured data to the stator receiver 124. Stator receiver relays the information to the computational unit 120 for processing as described above, and as will be described in more detail below. It is to be noted that this optional modification could be applied to any embodiment of the present invention.

This embodiment uses five sensors mounted on the exciter armatures and a single wireless control signal is passed to the stator during rotating diode failure. This greatly reduces the number of sensors and reduces the number of transmitting signals of the rotor. Fewer signals to the controller lead to lower computational complexity hence lower power consumption. The proposed detection method is very fast due to direct measurement of exciter armature phase voltages and line currents and is particularly suitable for brushless synchronous machines.

Figure 11:
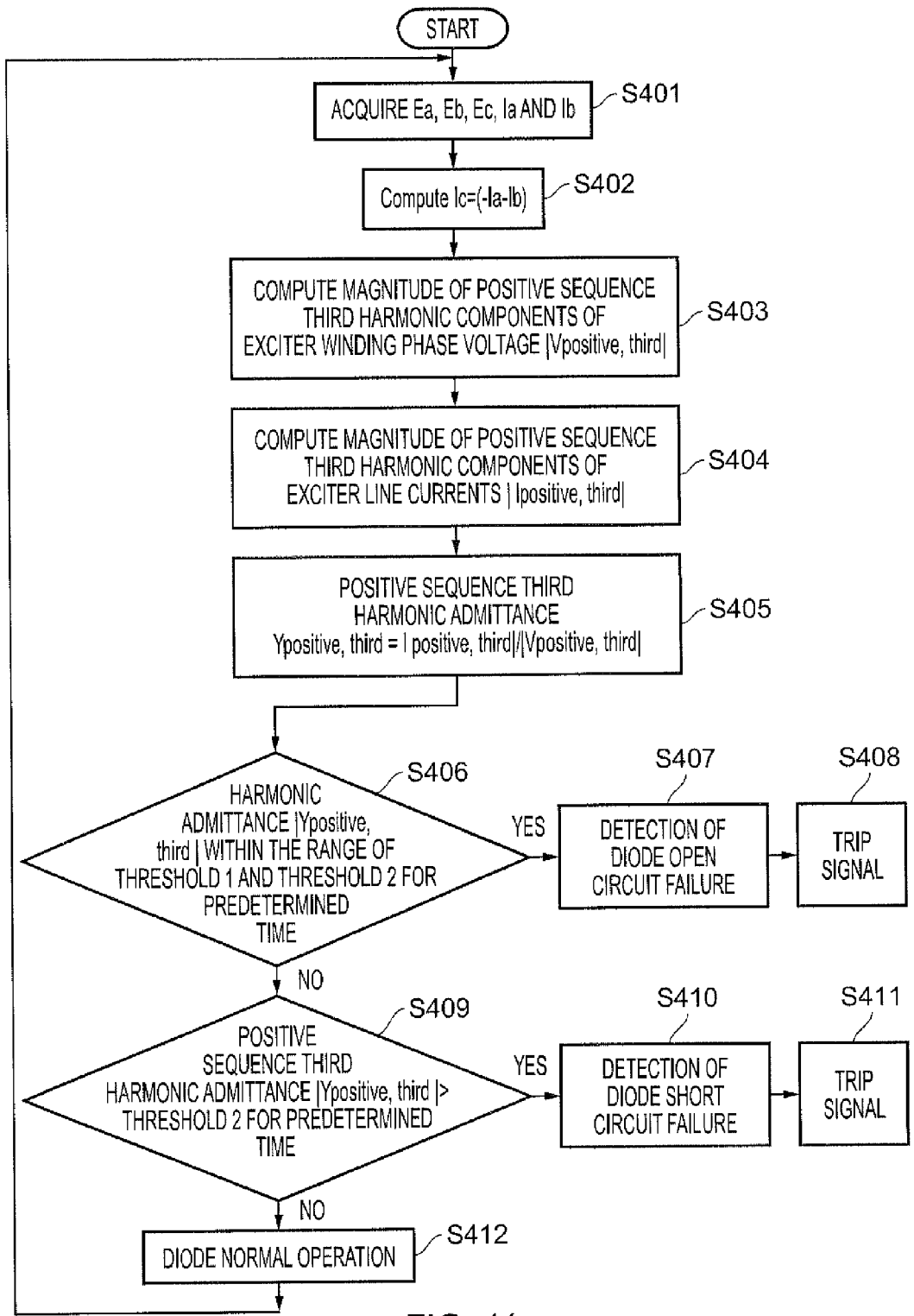
FIG. 11 shows a flowchart representative of another process embodying the present invention.

FIG. 11 shows in detail an algorithm/methodology flowchart according to this fifth embodiment of the present invention.

In S401 voltages Ea, Eb and Ec representing the voltages measured across the respective exciter armatures 106-1, 106-2, 106-3 of the exciter armature winding 106 are acquired, e.g. measured. Currents Ia and Ib, representing the currents measured in two of the three exciter armatures, are acquired, e.g. measured.

In S402 the third current Ic in the third of the three exciter armatures is calculated, based on the acquired measured currents Ia and Ib, and on the basis of the measured voltages and/or information about the physical configuration (and/or rotational speed) of the exciter armature winding 106 itself.

Acquiring the five measured parameters (by measuring the three voltages and the two currents) and acquiring the sixth value (by calculation) can be considered to be acquiring all six values. Thus, S401 and S402 may be considered to be substeps of an overarching step of acquiring the voltage across each exciter armature, and acquiring the current flowing in each armature. Naturally, the sixth value (e.g. the third current) could also be acquired by measurement rather than by calculation.

In S403, on the basis of the acquired values for the voltages across the respective exciter armatures, the magnitude of the positive sequence third harmonic components of the exciter armature voltages is calculated. The skilled person knows how to calculate this.

In S404, on the basis of the acquired values for the line currents in the respective exciter armatures, the magnitude of the positive sequence third harmonic components of the exciter armature line currents is calculated. The skilled person knows how to calculate this.

In S405, using the harmonic components calculated in S403 and S404, the positive sequence third harmonic admittance of the rectifying circuit 108 is calculated. The skilled person knows how to calculate this.

S403 to S405 represent a process that may be used in S303 above.

In S406 it is judged whether or not the calculated positive sequence third harmonic admittance lies within the range of, that is between, predetermined "threshold 1" and predetermined "threshold 2", e.g. for a predetermined length of time.

If the determination in S406 is positive, then it is determined that a fault has occurred in a rotating diode. In particular, because the judgement in s406 is that the calculated positive sequence third harmonic admittance lies within the range of predetermined "threshold 1" and predetermined "threshold 2", e.g. for a predetermined length of time, then it is determined that one or more of the rotating diodes has suffered an open circuit fault or failure.

Accordingly, in S408 a signal may be issued to control the operation of the generator accordingly, for example, a trip signal may be issued to stop the operation of the generator.

Before, after or simultaneously with the judgement in S406, it is judged in S409 whether or not the calculated positive sequence third harmonic admittance exceeds the predetermined "threshold 2", e.g. for a predetermined length of time.

If the determination in S409 is positive, then it is determined that a fault has occurred in a rotating diode. In particular, because the judgement in s406 is that the calculated positive sequence third harmonic admittance exceeds the predetermined "threshold 2", e.g. for a predetermined length of time, then it is determined that one or more of the rotating diodes has suffered a short circuit fault or failure.

Accordingly, in S410 a signal is issued to control the operation of the generator accordingly, for example, a trip signal may be issued to stop the operation of the generator.

If the determination in S406 and S409 is negative, then it is not determined that a fault has occurred in any of the rotating diodes. It may be determined that the rotating diodes are operating normally, i.e. that the rectifying circuit is operating normally.

The process may then return to S401 to be repeated.

The way in which the present invention is able to distinguish between open and short circuit faults will now be explained with reference to FIGS. 12 and 13.

A simulation model of the brushless synchronous generator (BLSG) of e.g. FIG. 9 has been developed, and the proposed algorithm/methodology has been verified by simulation in a MATLAB/Simulink environment.

Figure 12:
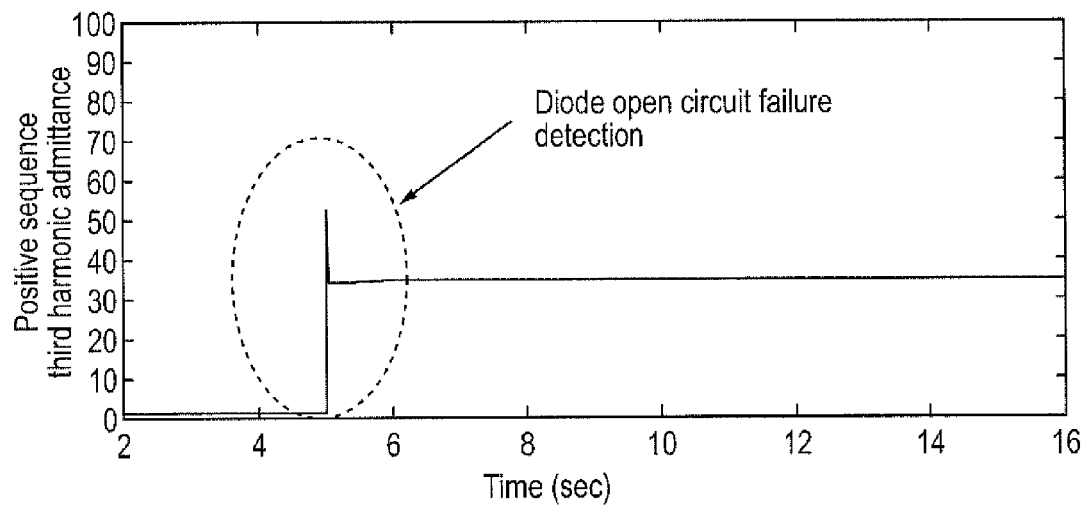
FIG. 12 shows the amplitude of the positive sequence third harmonic admittance for a rectifying circuit including an open circuit rotating diode fault.

FIG. 12 shows the simulation results for the variation of the positive sequence third harmonic admittance over time with one open circuit diode present in the rectifying circuit 108. The open circuit diode fault is emulated at t=5 seconds. Failure detection is possible within a very short period of time due to direct measurement of exciter armature phase voltages and line currents.

Figure 13:
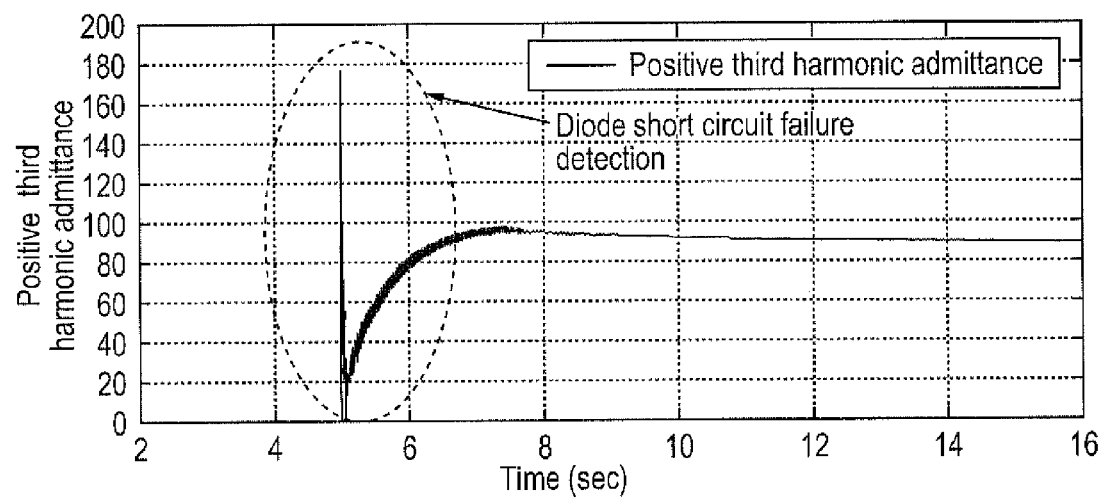
FIG. 13 shows the amplitude of the positive sequence third harmonic admittance for a rectifying circuit including a short circuit rotating diode fault.

FIG. 13 shows the simulation results for the variation of the positive sequence third harmonic admittance over time with one short circuited diode present in the rectifying circuit 108. The short circuit diode fault is emulated at t=5 seconds and failure detection is possible within a very short period of time after diode short circuit failure due to direct measurement of exciter armature phase voltages and line currents.

It will be noted that the steady state level of the positive sequence third harmonic admittance after the fault is much higher in the short circuit fault than in the open circuit fault. Therefore, it is possible to predefine two suitable thresholds, such that when the positive sequence third harmonic admittance lies between the two thresholds it can be determined that the open circuit fault has occurred in a rotating diode, whereas if the positive sequence third harmonic admittance is found to exceed both thresholds, then it can be determined that the short circuit fault has occurred in a rotating diode.

Indeed, this aspect (of being able to distinguish between open and short circuit faults in rotating diodes) is not limited to this embodiment. All embodiments of the present invention provide this capability.

This can be seen with reference to e.g. FIGS. 4 and 5. Here it is again clear that the steady state of the voltage difference ratio after the short circuit fault as emulated at t=8 seconds is significantly higher than the equivalent steady state of the difference ratio for the open circuit fault. Therefore, all embodiments of the present invention may optionally include the feature of being able to determine normal operation and an open or short circuit fault in one or more rotating diodes, by comparison of a value derived from measured signal parameters associated with the exciter armature winding with a plurality of threshold values.

Figure 14:
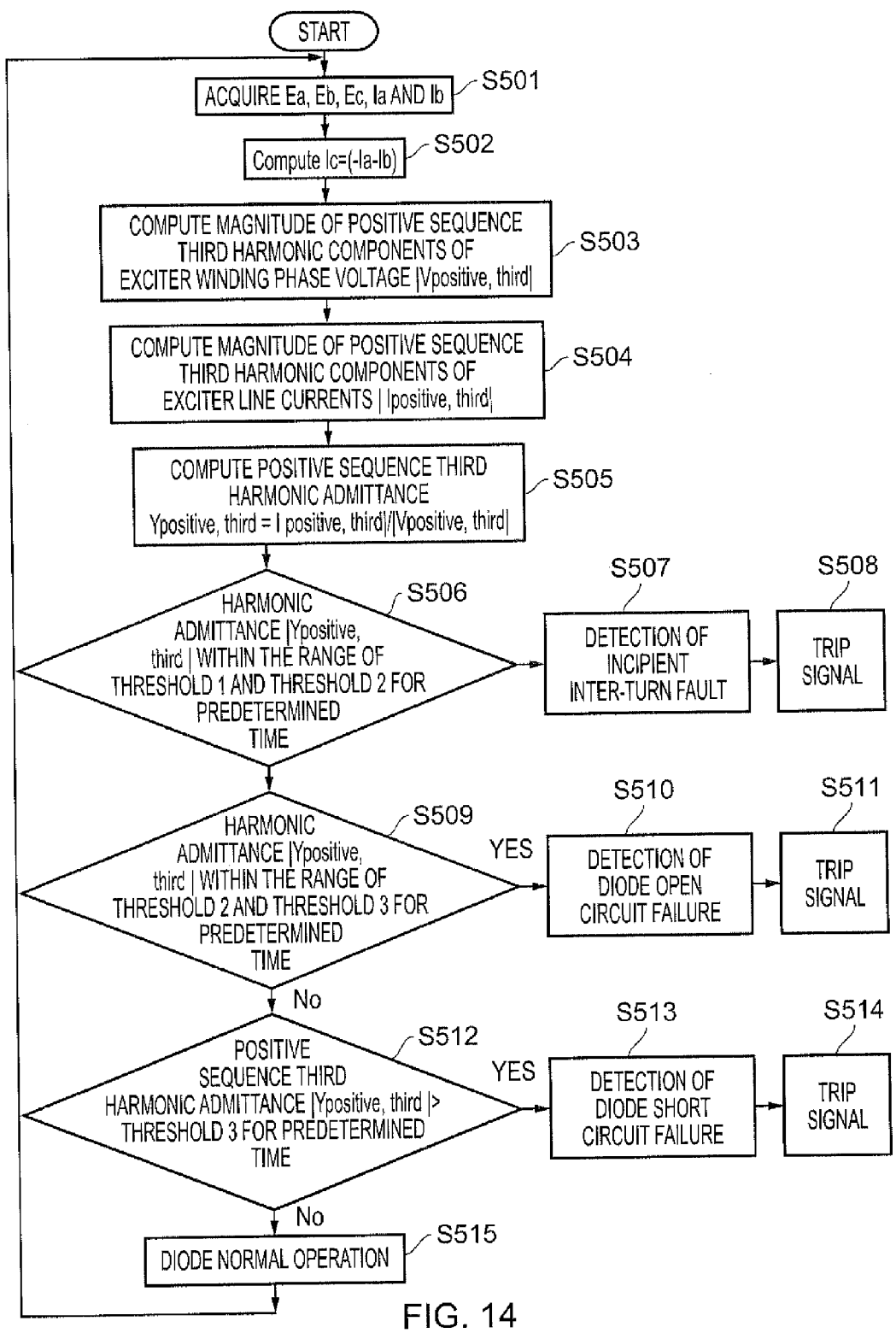
FIG. 14 shows a flowchart representative of another process embodying the present invention.

An optional modification of the algorithm/methodology is represented in FIG. 14. In the process shown in FIG. 14, S501-S505 are similar to S401-S405.

S509-S511 are similar to S406-S408, except that the harmonic admittance is assessed relative to a range defined by thresholds "threshold 2" and "threshold 3" in S506 rather than "threshold 1" and "threshold 2" as in S406. The values of "threshold 2" and "threshold 3" in S506 may respectively correspond precisely to the values of "threshold 1" and "threshold 2" in S406.

S512-S514 are similar to S409-S411, except that the harmonic admittance is assessed relative to "threshold 3" in S512 rather than "threshold 2" in S409. The value of "threshold 3" in S506 may correspond precisely to the value of "threshold 2" in S406.

In S506 it is judged whether or not the positive sequence third harmonic admittance lies within the range of, that is between, predetermined "threshold 1" and predetermined "threshold 2", e.g. for a predetermined length of time.

If the determination in S506 is positive, then it is determined that an inter-turn fault has occurred in one or more of the armature windings. The inter-turn fault may be detected as an incipient inter-turn fault.

Accordingly, in S508 a signal is issued to control the operation of the generator accordingly, for example, a trip signal may be issued to stop the operation of the generator.

Thus, the present invention provides the ability to be able to detect not only faults in the rectifier circuit 108, in particular faults in one or more of the rotating diodes, but it also provides the ability to be able to detect inter-turn faults, in particular incipient inter-turn faults, in the armature windings.

Figure 15:
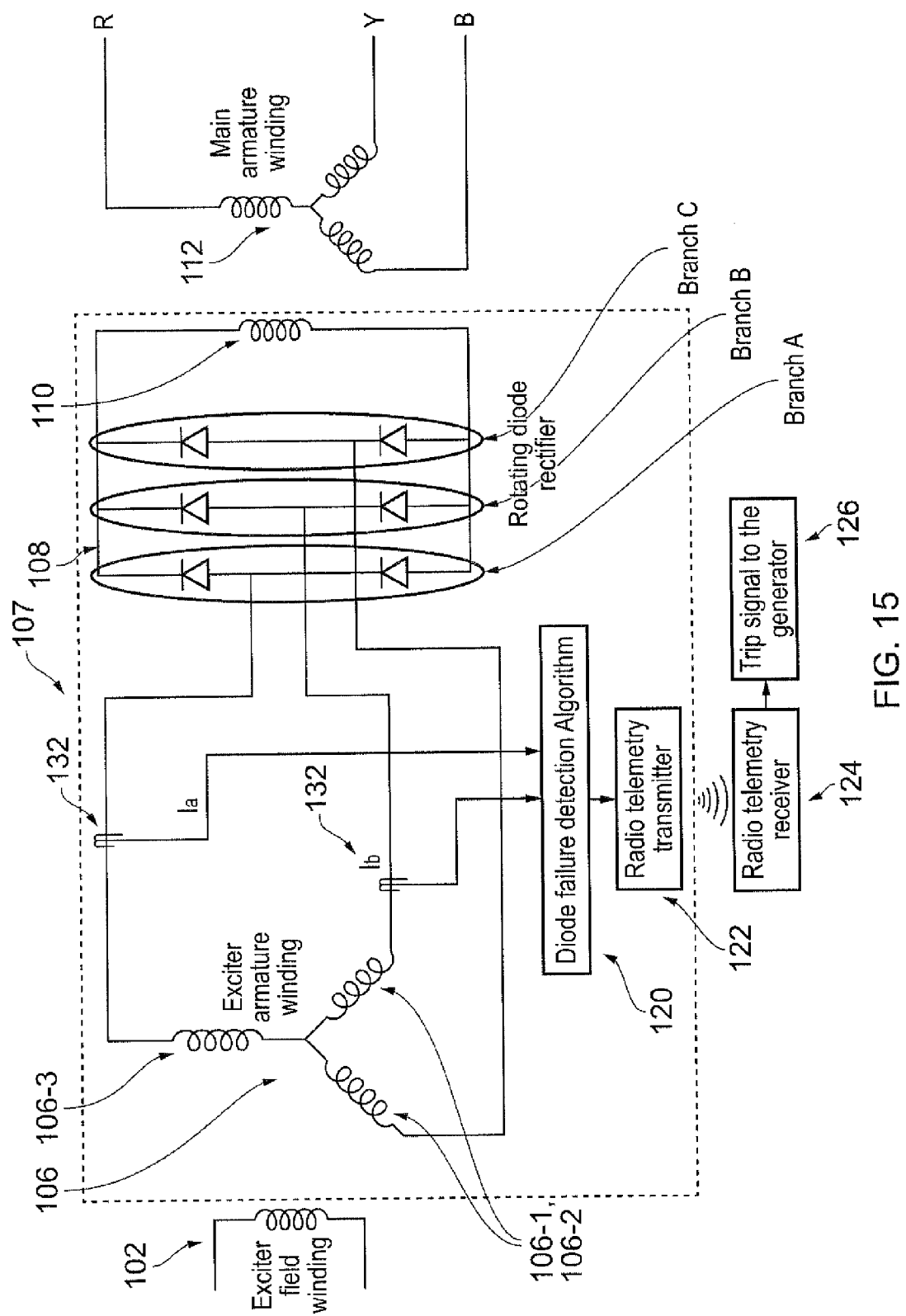
FIG. 15 shows a BLSG including another embodiment of the present invention.

FIG. 15 shows an alternative embodiment which employs only two sensors, and therefore may represent the most cost efficient way to implement the invention.

FIG. 15 shows branches A, B and C of the rectifying circuit. In a first method using the embodiment shown in FIG. 15, a fault in a subset of the branches of the rectifying circuit 108 can be detected. By acquiring, e.g. measuring, the current from branches 106-2 and 106-3, it is possible to detect a fault in Branch A or Branch B in accordance with any suitable method described herein. For example, a ratio of the acquired currents in branches 106-2 and 106-3 can be calculated and compared with one or more threshold values in a similar way to that explained with reference to FIG. 2. When a threshold value is exceeded by the ratio, then it can be determined that a fault has occurred in Branch A or Branch B of the rectifying circuit.

As a modification of this method, the current in the third armature (or other armatures, if present) can be calculated based on the acquired, e.g. measured, currents, and thus a fault can be detected in any of the three branches A, B or C, in accordance with any suitable method described herein; in particular, in accordance with a method associated with FIG. 8 in which three currents are shown to be acquired by measurement.

The present invention may be embodied in software. For example, the present invention may be provided as a computer program, which when run by a computer, causes the computer to execute any method disclosed herein. The computer program may be provided as a computer program product. For example, the computer program may be provided on a computer readable medium, e.g. a storage medium.

It is to be noted that any feature of any embodiment can be introduced into any other embodiment where it is technically possible to do so, unless that introduction is explicitly said to be undesirable.

The present invention is applicable to both small and large induction machines, e.g. BLSG machines, for the fast detection of rectifier failure and inter-turn short circuit(s) in the exciter armature winding. For example, requirements for civil and defense aircrafts are growing and driving the need for More Electric Aircraft. Indeed, advances in power electronics and electrical machines have permitted the use of BLSG coupled to gas turbine engines. Such applications require fast detection of rectifier failure to avoid severe damage to the BLSG exciter circuit (including the exciter armature winding and the rotating diode rectifier circuit) and generator control unit.

The invention claimed is:

1. A method for detecting a fault in an exciter circuit, suitable for use in a brushless generator, the exciter circuit including
    an exciter armature winding, having a plurality of armatures, arranged to generate a multiphase AC signal, each armature of the plurality of armatures providing a respective signal component of the multiphase AC signal, and
    a rectifier circuit for receiving the signal components from the respective armatures, the rectifier circuit comprising a plurality of diodes arranged to rectify the signal component of each armature to provide a rectified output signal, wherein the method includes the steps of:

acquiring, for each signal component of at least two of the plurality of armatures, a respective characteristic value for a first characteristic of each signal component;

acquiring, for each signal component of the at least two of the plurality of armatures, a respective further characteristic value for a second characteristic of each signal component;

calculating the magnitude of the $n^{th}$ order harmonic component for each acquired characteristic value;

calculating the magnitude of the $n^{th}$ order harmonic component for each acquired further characteristic value;

on the basis of the calculated magnitudes, calculating the $n^{th}$ order harmonic admittance and/or impedance of the rectifier circuit; and determining whether a fault has occurred in the exciter circuit on the basis of the $n^{th}$ order harmonic admittance and/or impedance of the rectifier circuit.

2. A method according to claim 1, further including determining the type of fault in the exciter circuit on the basis of the $n^{th}$ order harmonic admittance and/or impedance of the rectifier circuit.

3. A method according to claim 1, wherein each characteristic value and further characteristic value is indicative of the current flowing in the respective armature or of the voltage across the respective armature.

4. A method according to claim 1, wherein the step of calculating an $n^{th}$ order harmonic admittance and/or impedance of the rectifier circuit comprises calculating the third harmonic admittance and/or impedance of the rectifier circuit.

5. A method according to claim 1, wherein the harmonic components are the positive sequence components, and the calculated harmonic admittance and/or impedance is the positive sequence harmonic admittance and/or impedance.

6. A method according to claim 1, wherein the step of determining whether a fault has occurred includes the steps of:

comparing the $n^{th}$ order harmonic admittance and/or impedance of the rectifier circuit with a predetermined range of known fault values; and determining that a fault has occurred in the exciter circuit if the $n^{th}$ order harmonic admittance and/or impedance of the rectifier circuit lies within the predetermined range of known fault values.

7. A method according to claim 6, wherein the predetermined range of known fault values includes a first sub-range of known first fault values, and a second sub-range of known second fault values, and the method includes the step of determining that a first fault has occurred in the exciter circuit if the $n^{th}$ order harmonic admittance and/or impedance of the rectifier circuit lies within the first sub-range; and/or determining that a second fault has occurred in the exciter circuit if the $n^{th}$ order harmonic admittance and/or impedance of the rectifier circuit lies within the second sub-range, the first and second faults being different types of fault.

8. A method according to claim 7, wherein the predetermined range of known fault values includes a third sub-range of known third fault values, and the method includes the step of determining that a third fault has occurred in the exciter circuit if the $n^{th}$ order harmonic admittance and/or impedance of the rectifier circuit lies within the third sub-range, the third fault being a different type of fault to the first and second types of fault.

9. A method according to claim 1, wherein the method is executed repeatedly, over time, to generate a series of $n^{th}$ order harmonic admittance and/or impedance of the rectifier circuits; and a fault is only determined to have occurred if a plurality of the generated series of $n^{th}$ order harmonic admittance and/or impedance of the rectifier circuits lie within the predetermined range of known fault values within a predetermined length of time.

10. A method according to claim 1, wherein the step of determining whether a fault has occurred includes the step(s) of:

determining whether a fault has occurred in one or more diodes of the plurality of diodes; and/or determining whether an inter-turn fault has occurred in the exciter armature winding.

11. A method according to claim 10, wherein a first fault is an open circuit fault in the one or more diodes; and/or a second fault is a short circuit fault in the one or more diodes.

12. An apparatus for detecting a fault in an exciter circuit, suitable for use in a brushless generator, the exciter circuit including an exciter armature winding, having a plurality of armatures, arranged to generate a multiphase AC signal, each armature of the plurality of armatures providing a respective signal component of the multiphase AC signal, and a rectifier circuit for receiving the signal components from the respective armatures, the rectifier circuit comprising a plurality of diodes arranged to rectify the signal component to provide a rectified output signal, wherein the apparatus includes a processor arranged to perform the method according to claim 1.

13. An apparatus according to claim 12, further including a respective sensor arranged to provide each characteristic value or further characteristic value by measuring the signal component in the respective armature; wherein the processor is arranged to acquire the characteristic value or further characteristic values from the respective sensors.

* * * * *